United States Patent
Do

(10) Patent No.: US 7,916,558 B2
(45) Date of Patent: Mar. 29, 2011

(54) SEMICONDUCTOR MEMORY DEVICE AND METHOD FOR READING/WRITING DATA THEREOF

(75) Inventor: Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/650,311

(22) Filed: Dec. 30, 2009

(65) Prior Publication Data

US 2010/0103752 A1 Apr. 29, 2010

Related U.S. Application Data

(62) Division of application No. 12/005,964, filed on Dec. 28, 2007, now Pat. No. 7,663,943.

(30) Foreign Application Priority Data

Jun. 8, 2007 (KR) .............................. 2007-0055966

(51) Int. Cl.
  *G11C 7/00* (2006.01)
  *G11C 7/22* (2006.01)
(52) U.S. Cl. ............... 365/191; 365/189.15; 365/189.16
(58) Field of Classification Search .................. 365/191
  See application file for complete search history.

(56) References Cited

U.S. PATENT DOCUMENTS

| | | | |
|---|---|---|---|
| 5,426,603 A | 6/1995 | Nakamura et al. | 365/149 |
| 5,475,692 A | 12/1995 | Hatano et al. | 714/719 |
| 5,808,950 A * | 9/1998 | Suzuki | 365/203 |
| 6,353,574 B1 | 3/2002 | Shim | |
| 6,449,198 B1 | 9/2002 | Hamade et al. | |
| 6,819,611 B2 | 11/2004 | Keeth | 365/205 |
| 6,850,444 B2 | 2/2005 | Cho | |

FOREIGN PATENT DOCUMENTS

| | | |
|---|---|---|
| JP | 2005-310345 | 11/2005 |
| JP | 2006-114192 | 4/2006 |
| KR | 10-1999-0080756 A | 11/1999 |
| KR | 10-2003-0057368 A | 7/2003 |

\* cited by examiner

*Primary Examiner* — Son L Mai
(74) *Attorney, Agent, or Firm* — Blakely, Sokoloff, Taylor & Zafman

(57) ABSTRACT

A semiconductor memory device is capable of writing data in phase with external data to a memory cell regardless of which memory cell the data is written to. The semiconductor memory device includes a scrambler, a write selector and a read selector. The scrambler is configured to output a control signal activated when an address for accessing a memory cell of a complementary bit line is inputted. The write selector is configured to selectively transmit data of a write path in response to the control signal. The read selector is configured to selectively transmit data of a read path in response to the control signal.

5 Claims, 8 Drawing Sheets

SEMICONDUCTOR MEMORY DEVICE AND METHOD FOR READING/WRITING DATA THEREOF

CROSS-REFERENCE TO RELATED APPLICATION

The present patent application is a Divisional application claiming the benefit of application Ser. No. 12/005,964, filed Dec. 28, 2007 now U.S. Pat. No. 7,663,943.

CROSS-REFERENCE TO RELATED APPLICATIONS

The present invention claims priority to Korean patent application number 10-2007-0055966, filed on Jun. 8, 2007, which is incorporated by reference in its entirety.

BACKGROUND OF THE INVENTION

The present invention relates to a semiconductor memory device, and more particularly to a semiconductor memory device with a simplified test pattern.

Generally, semiconductor memory devices include a plurality of memory cells provided with one group of memory cells for which data are inputted/outputted via a bit line BL and the other group of memory cells for which data are inputted/outputted via a complementary bit line, i.e. a bit line bar BLB.

FIG. 1 is a block diagram illustrating connections of bit line pairs BL and BLB and word lines WL in a cell array of a conventional semiconductor memory device. FIG. 1 illustrates a cell array structure of a typical semiconductor memory device, which is called a folded bit line structure In the typical semiconductor memory device, a word line WL is selected by an X address and a bit line sense amplifier BLSA is assigned by a Y address, so that data of a memory cell are inputted/outputted to/from memory cells. In FIG. 1, memory cells of zeroth, third, fourth and seventh word lines WL0, WL3, WL4 and WL7 are connected to bit lines BL, and memory cells of first, second, fifth and sixth word lines WL1, WL2, WL5 and WL6 are connected to complementary bit lines BLB. In the typical semiconductor memory device, when an external data is '0', i.e., a logic low level, data '0' is written to the memory cell connected to the bit line BL, but data '1' (a logic high level) is written to the memory cell connected to the complementary bit line BLB.

Even though the same data is inputted from the outside, data actually written to a memory cell may become different depending on its address. That is, the written data is in phase or out of phase with the inputted data according to the address. This inconsistency of the data phase according to the address also occurs in a structure where a data input/output line of the bit line sense amplifier BLSA is provided in pair, for example, an open bit line structure, as well as the folded bit line structure of FIG. 1.

FIG. 2 illustrates a block diagram of a conventional semiconductor memory device. The conventional semiconductor memory device, which performs read/write operations of data from/to a memory cell, includes an address buffer, a state machine, an X address block, a Y address block, a row address strobe (RAS) logic, a column address strobe (CAS) logic, an X decoder, a Y decoder, a data transfer block, a write driver WDRV, an input/output sense amplifier IOSA, a bit line pair BL and BLB, and a word line WL.

The address buffer is configured to receive an address. The state machine is configured to decode a command. The write driver WDRV transfers data of a global input/output line GIO to a local input/output line LIO in a write operation. The input/output sense amplifier IOSA transfers data of the local input/output line LIO to the global input/output line GIO in a read operation. The bit line pair BL and BLB is connected to a bit line sense amplifier BLSA and memory cells storing data. The word line WL controls a gate of the memory cell. The read/write operations of data in the conventional semiconductor memory device is well known to a person of ordinary skill in the art, and hence further detailed description for them will be omitted herein.

FIG. 2 illustrates only four memory cells for simplicity, in which two memory cells are connected to the bit line BL and the other two memory cells are connected to the complementary bit line BLB. When the external data '0' is inputted through a DQ pin in an embodiment of FIG. 2, an in-phase data, i.e., '0', is written to the memory cell connected to the bit line BL but an out-of-phase data, i.e., '1', is written to the memory cell connected to the complementary bit line BLB.

According to the conventional memory device as described above, the data, which is identical or inverse to the external data, may be written to the memory cell depending on which memory cell the data is written to, that is, depending on which memory cell the data is written between the memory cells connected to the bit line BL and the complementary bit line BLB. Therefore, the checking of data pass/fail in a testing procedure should always be performed in consideration of the relation with the address, which makes it difficult to perform the analysis.

SUMMARY OF THE INVENTION

Embodiments of the present invention are directed to providing a semiconductor memory device where data in phase with external data is written to a memory cell regardless of which memory cell the data is written to, and a method for reading/writing data of the semiconductor memory device.

In one embodiment, a semiconductor memory device includes a scrambler configured to output a control signal activated when an address for accessing a memory cell of a complementary bit line is inputted, a write selector configured to selectively transmit data of a write path in response to the control signal, and a read selector configured to selectively transmit data of a read path in response to the control signal In another embodiment, a semiconductor memory device includes a scrambler configured to output a write control signal and a read control signal activated when an address for accessing a memory cell of a complementary bit line is inputted, wherein activation points of the write control signal and the read control signal are synchronized with timings of write and read operations, respectively, a write selector configured to selectively transmit data of a write path in response to the write control signal, and a read selector configured to selectively transmit data of a read path in response to the read control signal.

In still further embodiment, a method for writing data to a semiconductor memory device includes activating a control signal when an address for accessing a memory cell of a complementary bit line is inputted during a write operation, and selectively transmitting data of a write path in response to the control signal.

In still further embodiment, a method for reading data from a semiconductor memory device includes activating a control signal when an address for accessing a memory cell of a complementary bit line is inputted during a read operation, and selectively transmitting data of a read path in response to the control signal.

The feature of the present invention is to consistently write data to memory cells when external data is written to a semiconductor memory device. In the conventional memory device, when the external data, e.g., '0', is written to a memory cell, data '1' may be stored in some memory cells and data '0' may be stored in other memory cells, thus not providing the consistency between the external data and the data actually stored in the memory cells. Accordingly, the embodiments of the present invention are directed to provide a semiconductor memory device in which one of data '0' and '1' is written to all the memory cells in common when the external data '0' is written to the memory cells.

To this end, data is inverted and then written to a complementary bit line, and the written data is re-inverted and then read out. The complementary bit line described herein refers to a bit line where memory cells, with data which should be inverted so as to achieve the consistency between the external data and the data stored in the memory cell, are connected. For example, in order to consistently write the data '0' to all the memory cells when the external data '0' is written to the memory cell, a bit line bar BLB may become the complementary bit line in FIG. 2. Likewise, in order to write the data '1' to all the memory cells when the external data '0' is written to the memory cell, a bit line BL may become the complementary bit line as defined above. Hereinafter, description will be made assuming that the bit line bar BLB is the complementary bit line.

DESCRIPTION OF SPECIFIC EMBODIMENTS

Hereinafter, a semiconductor memory device and a method for reading/writing data thereof in accordance with the present invention will be described in detail with reference to the accompanying drawings.

Figure 1:
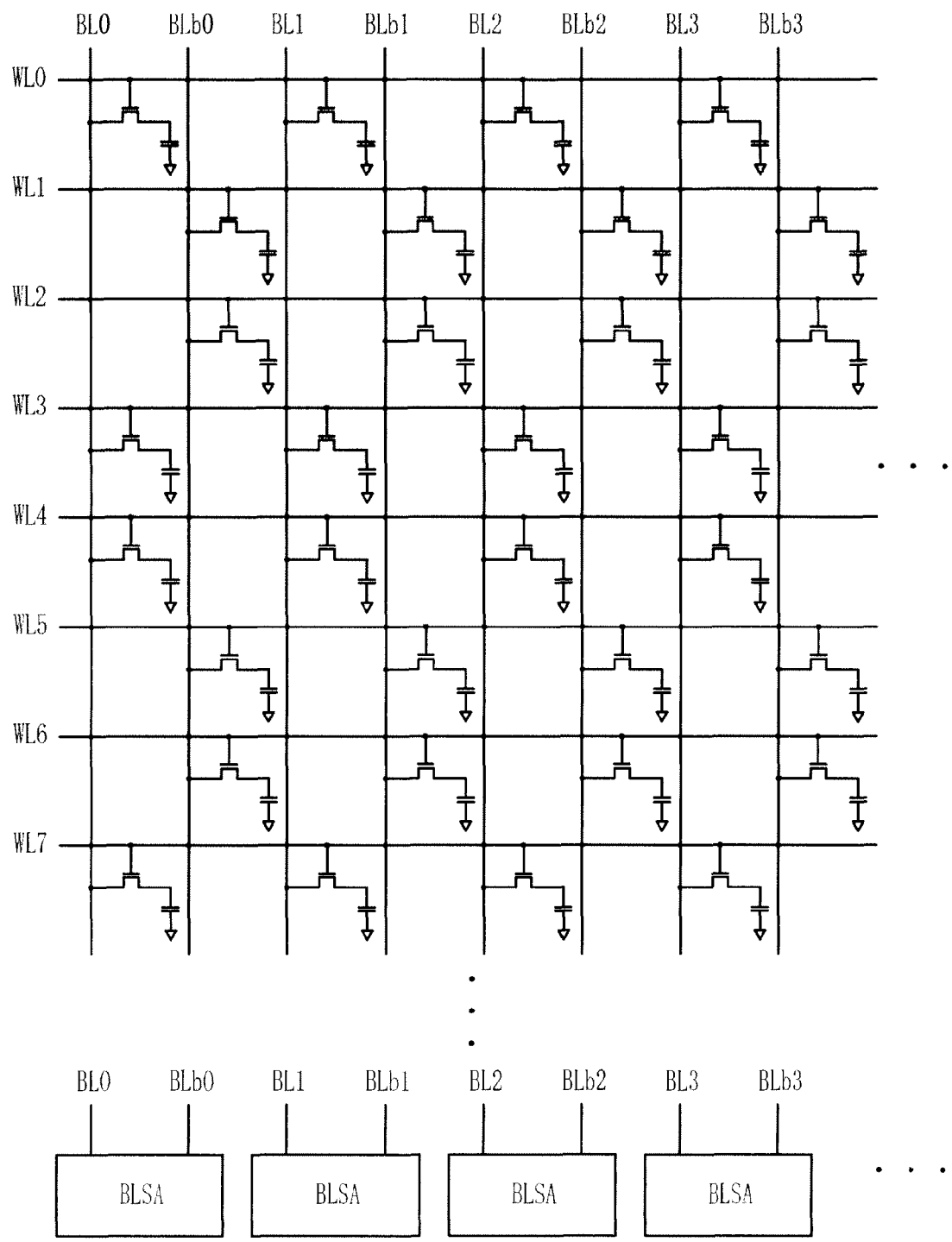
FIG. 1 is a block diagram illustrating connections of bit line pairs and word lines in a cell array of a conventional semiconductor memory device.
Figure 2:
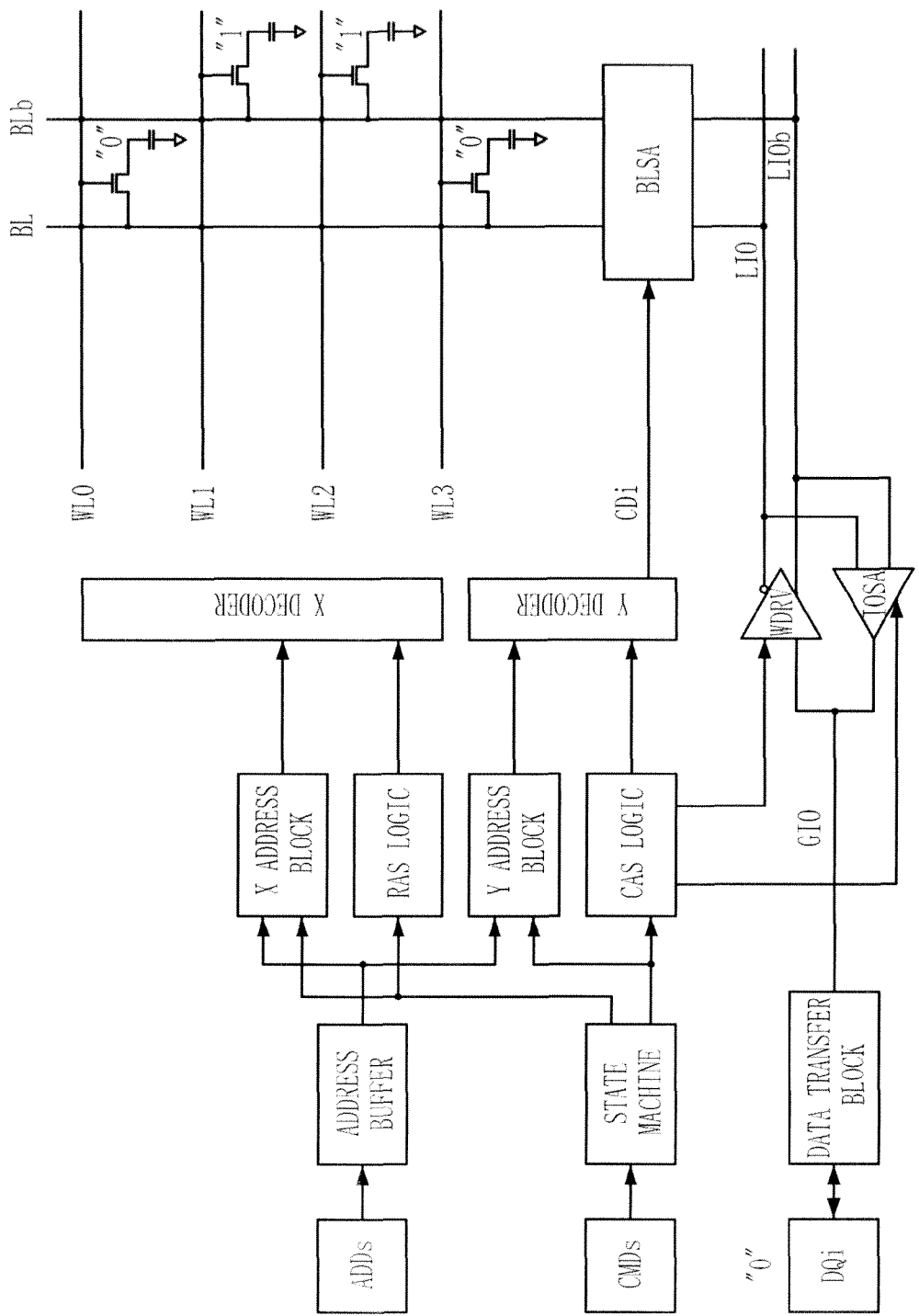
FIG. 2 illustrates a block diagram of a conventional semiconductor memory device.
Figure 3:
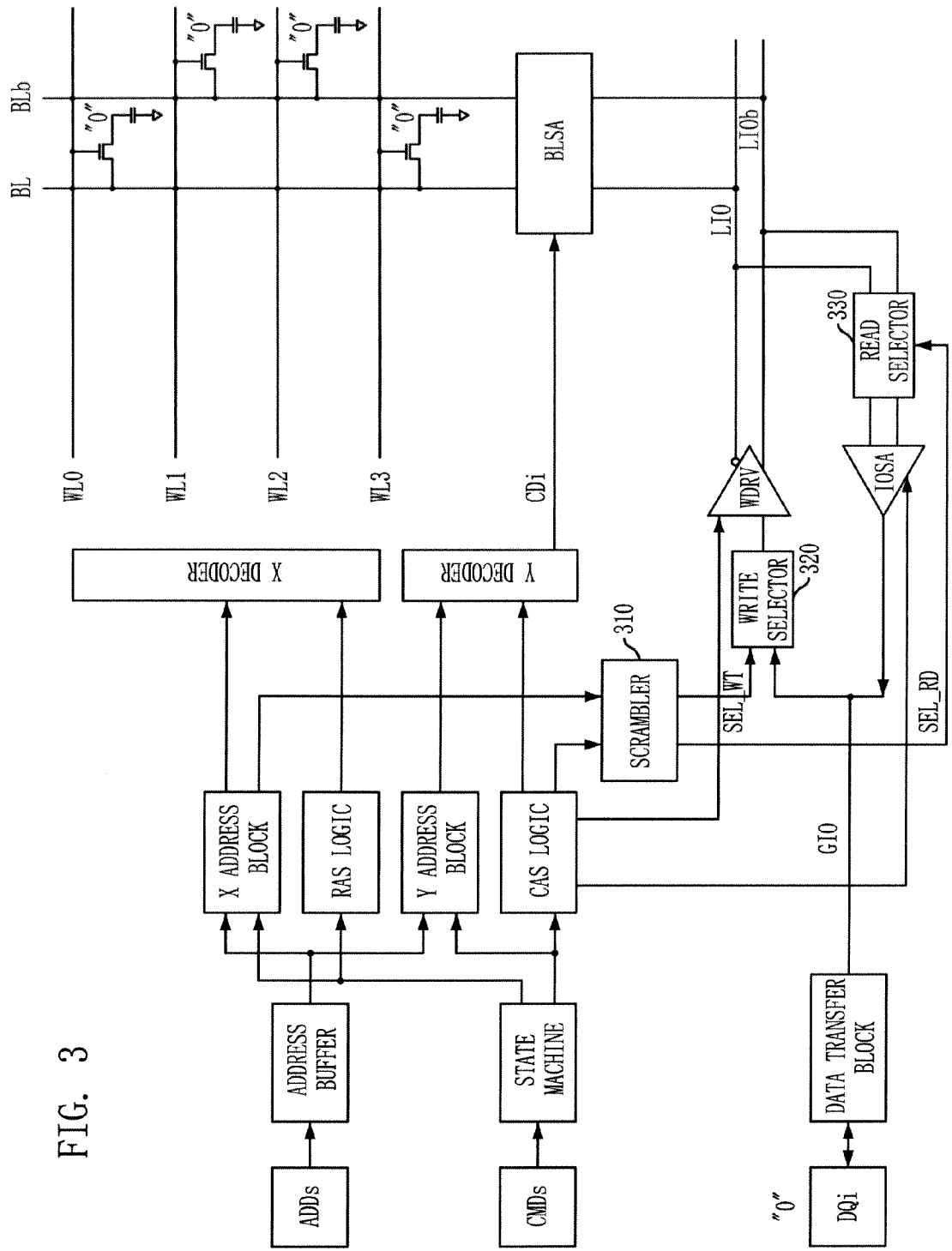
FIG. 3 illustrates a block diagram of a semiconductor memory device in accordance with the present invention.

FIG. 3 illustrates a block diagram of a semiconductor memory device in accordance with the present invention.

Referring to FIG. 3, the semiconductor memory device in accordance with the present invention includes a scrambler 310, a write selector 320 and a read selector 330. The scrambler 310 outputs a control signal SEL which is activated when an address for accessing a complementary bit line BLB is inputted. The write selector 320 selectively transmits data of a write path in response to the control signal SEL. The read selector 330 selectively transmits data of a read path in response to the control signal SEL.

The scrambler 310 generates the control signal SEL when the address for accessing the memory cell of the complementary bit line BLB is inputted. That is, in the semiconductor memory device having the configuration of FIG. 3, the control signal SEL is activated when an X address is an address for accessing a first or a second word line WL1 or WL2. Here, the control signal SEL may be divided into two control signals of which one is a write control signal SET_WT inputted to the write selector 320 and the other is a read control signal SET_RD inputted to the read selector 330. In this case, the two control signals SEL_WT and SEL_RD may be set such that they have the same activation condition and timing with each other or they have the same activation condition but different activation timings from each other, which will be more fully described with reference to FIGS. 4 and 5 showing the scrambler 310.

The write selector 320 inverts the data of the write path in response to the activation of the write control signal SEL_WT. Although the write selector 320 may transmit data of a global input/output line GIO inputted to a write driver WDRV or transmit the output of the write driver WDRV, it is illustrated in FIG. 3 that the write selector 320 transmit the data of the global input/output line GIO inputted to the write driver WDRV. Since the external data to be written to the memory cell of the complementary bit line BLB are inverted in advance by the write selector 320, data in phase with the external data can be written to the complementary bit line BLB, which is significantly different from the conventional semiconductor memory device. It can be observed in FIG. 3 that the data '0' is written to the memory cells of the complementary bit line BLB even when the external data '0' is inputted through a DQ pin.

The read selector 330 inverts data of a read path in response to the activation of the read control signal SEL_RD. Likewise, the read selector 330 can be configured to transmit data of any position of the read path, but it is illustrated in the embodiment that the read selector 330 transmit data of the local input/output line LIO inputted to an input/output sense amplifier IOSA. In accordance with the present invention, the data is inverted by the writer selector 320 and then written to the memory cell when the data is written to the memory cell of the complementary bit line BLB. The data stored in the memory cell of the complementary bit line BLB is then re-inverted to an original phase by the read selector 330 in a read operation. In other words, the semiconductor memory device in accordance with the present invention inverts the data and writes the inverted data to the memory cell of the complementary bit line BLB during the write operation, and reads the data stored in the memory cell of the complementary bit line BLB after re-inverting the written data. Accordingly, the memory device can operate normally like the conventional one.

Figure 4:
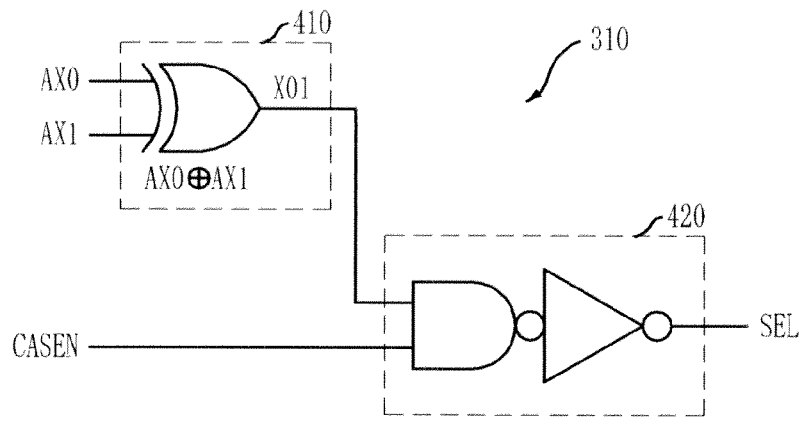
FIG. 4 illustrates a circuit diagram of an embodiment of a scrambler of FIG. 3.
Figure 5:
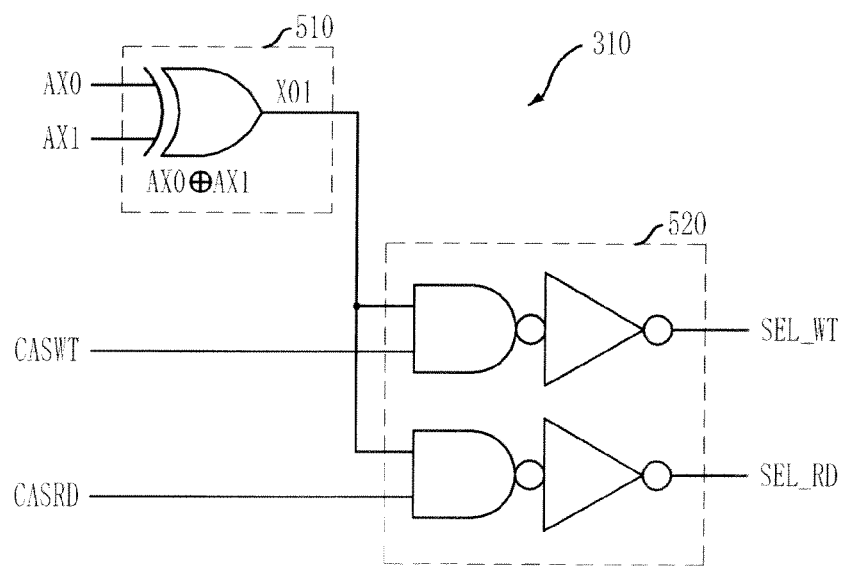
FIG. 5 illustrates a circuit diagram of another embodiment of a scrambler of FIG. 3.

FIG. 4 illustrates a circuit diagram of an embodiment of the scrambler 310 of FIG. 3.

Referring to FIG. 4, the scrambler 310 may include a decoder 410 and a trigger unit 420. The decoder 410 outputs a preliminary control signal X01 which is activated when addresses AX0 and AX1 for accessing the memory cells of the complementary bit line BLB are inputted. The trigger unit 420 outputs the control signal SEL in response to a column address strobe (CAS) enable signal CASEN activated in a read or write operation and a preliminary control signal X01.

FIG. 4 exemplarily illustrates the decoder 410 used in the semiconductor memory device of FIG. 3 including four word lines WL0, WL1, WL2 and WL3, in which the word lines WL1 and WL2 controlling the memory cells of the complementary bit line BLB are selected when the addresses AX0 and AX1 have different logic values. The decoder 410, however, may be differently structured depending on the memory device employing the spirit of the present invention.

The memory device may be only implemented such that the preliminary control signal X01 is activated when the word line WL controlling the complementary bit line BLB is selected, which can be easily realized by a person of ordinary skill in the art.

The trigger unit 420 controls the activation timing of the control signal SEL. Specifically, the trigger unit 420 generates the control signal SEL when the preliminary control signal X01 and the CAS enable signal CASEN are activated. The CAS enable signal CASEN is outputted from a CAS logic related to a column operation of the memory device, and activated during read/write operations of the memory device. FIG. 4 illustrates one embodiment of the scrambler 310 in the case where the write selector 320 and the read selector 330 are controlled by the same control signal SEL. That is, in the embodiment of FIG. 4, the control signal SEL is not divided into a write control signal and a read control signal.

FIG. 5 illustrates a circuit diagram of another embodiment of a scrambler 310 of FIG. 3.

While FIG. 4 illustrates the scrambler where the control signal SEL is not divided into a write control signal SEL_WT and a read control signal SEL_RD, FIG. 5 illustrates the scrambler where the control signal SEL is divided into the write control signal SEL_WT and the read control signal SEL_RD.

The scrambler 310 of FIG. 5 may include a decoder 510 and a trigger unit 520. The decoder 510 outputs the preliminary control signal X01 which is activated when the addresses AX0 and AX1 for accessing the memory cells of the complementary bit line BLB are inputted. The trigger unit 420 outputs the read control signal SEL_RD in response to a signal CASRD activated in the read operation of the memory device and the preliminary control signal X01, and outputs the write control signal SEL_WT in response to a signal CASWT activated in the write operation and the preliminary control signal X01.

The decoder 510 is the same as the decoder 410 of FIG. 4, but the trigger unit 520 differentiates from that of FIG. 4.

That is, FIG. 5 illustrates another embodiment of the scrambler 310 in which the control signal for the write selector 320 is different in timing from the control signal for the read selector 330. The trigger unit 520 in accordance with another embodiment outputs the read control signal SEL_RD in synchronization with the CASRD signal, and outputs the write control signal SEL_WT in synchronization with the CASWT signal.

Figure 6:
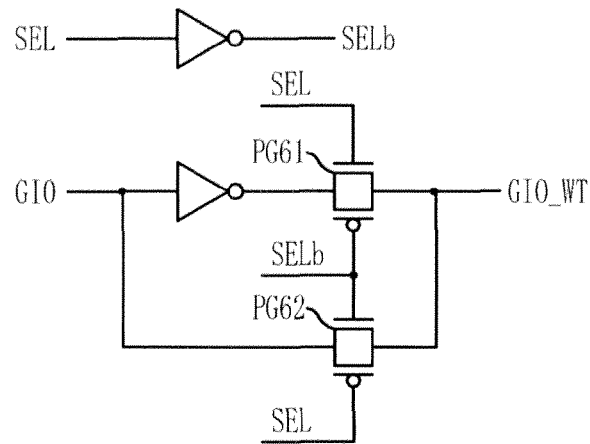
FIG. 6 illustrates a circuit diagram of an embodiment of a write selector of FIG. 3.

FIG. 6 illustrates a circuit diagram of an embodiment of the write selector 320 of FIG. 3.

Referring to FIG. 6, the write selector 320 includes a first pass gate PG61 and a second pass gate PG62. The first pass gate PG61 inverts data of the write path, i.e., GIO, and passes the inverted data. The second pass gate PG62 passes the data of the write path without inversion. The first and second pass gates PG61 and PG62 turns on/off by the control signal SEL (or write control signal SEL_WT).

As for an operation of the write selector 320, the first pass gate PG61 turns on when the control signal SEL is activated, and the second pass gate PG62 turns on when the control signal SEL is deactivated. Therefore, when the control signal SEL is activated, the write selector 320 inverts the data of the global input/output line GIO inputted to the write driver WDRV. On the contrary, when the control signal SEL is deactivated, the write selector 320 passes the data of the global input/output line GIO like the conventional semiconductor memory device.

Figure 7:
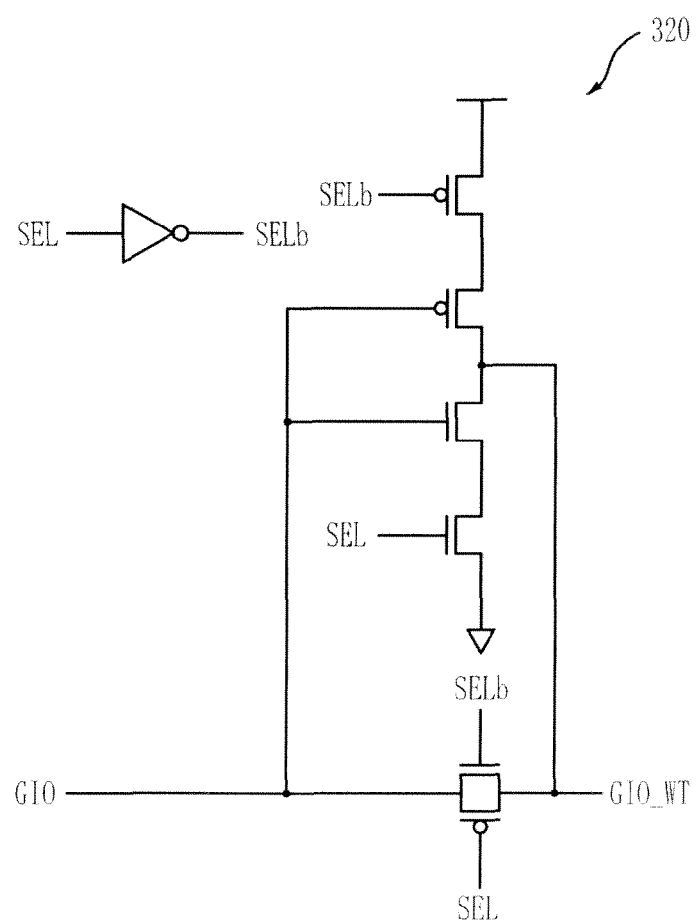
FIG. 7 illustrates a circuit diagram of another embodiment of a write selector of FIG. 3.

FIG. 7 illustrates a circuit diagram of another embodiment of the write selector 320 of FIG. 3.

The write selector 320 of FIG. 7 is different in structure from that of FIG. 6 but operates in the same manner as that of FIG. 6. That is, when the control signal SEL is activated, the write selector 320 of FIG. 7 inverts the data of the global input/output line GIO inputted to the write driver WDRV. Contrariwise, when the control signal SEL is deactivated, the write selector 320 passes the data of the global input/output line GIO.

Figure 8:
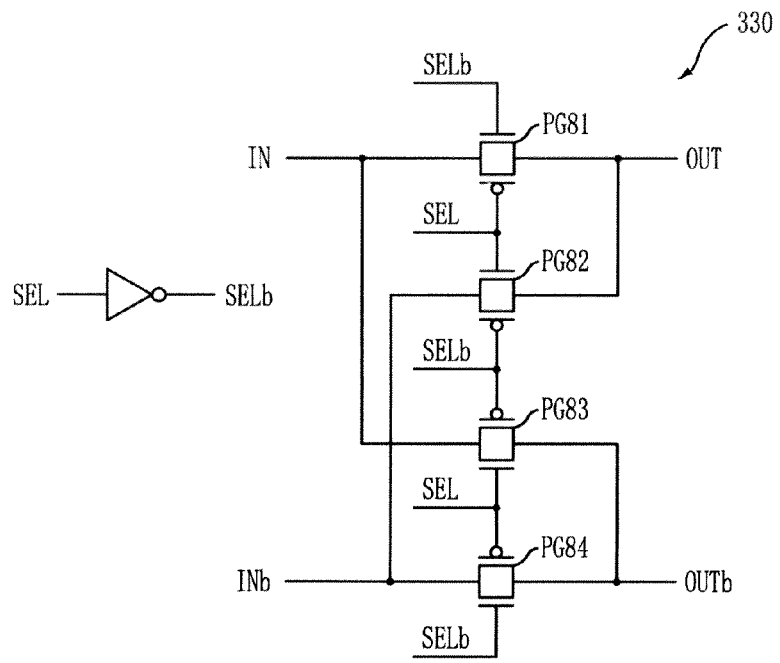
FIG. 8 illustrates a circuit diagram of an embodiment of a read selector of FIG. 3.

FIG. 8 illustrates a circuit diagram of an embodiment of the read selector 330 of FIG. 3.

The read selector 330 selectively transmits data of a read path in response to the control signal SEL (or the read control signal SEL_RD). FIG. 8 exemplarily illustrates that the read selector 330 inverts data of the local input/output line LIO/LIOB inputted to the input/output sense amplifier IOSA of the total read path.

As shown in FIG. 8, the read selector 330 may include a plurality of pass gates PG81, PG82, PG83 and PG84 configured to turn on/off in response to the control signal SEL, thereby passing the inverted data of the local input/output line LIO and LIOB (corresponding to IN and INB in FIG. 8, respectively) of the read path or passing the data without inversion.

As well known, the local input/output line is provided in pair, i.e., LIO and LIOB, and thus the inversion of data of the local input/output line can be achieved by changing the local lines LIO and LIOB with each other. The read selector 330 changes the local lines LIO and LIOB with each other in response to the control signal SEL.

As for the operation of the read selector 330, the pass gates PG82 and PG83 turn on when the control signal SEL is activated. Accordingly, data inputted through an input terminal IN is outputted via an output terminal OUTB, whereas data inputted through an input terminal INB is outputted via an output terminal OUT. In other words, when the data of the local input/output line LID and LIOB are inputted via the input terminals IN and INB, respectively, the data of the local input/output line LID and LIOB are inversely outputted via the output terminals OUTB and OUT, respectively. When the control signal SEL is deactivated, the pass gates PG81 and PG84 turn on so the data inputted through the input terminals IN and INB are respectively outputted through the output terminals OUT and OUTB without inversion.

Figure 9:
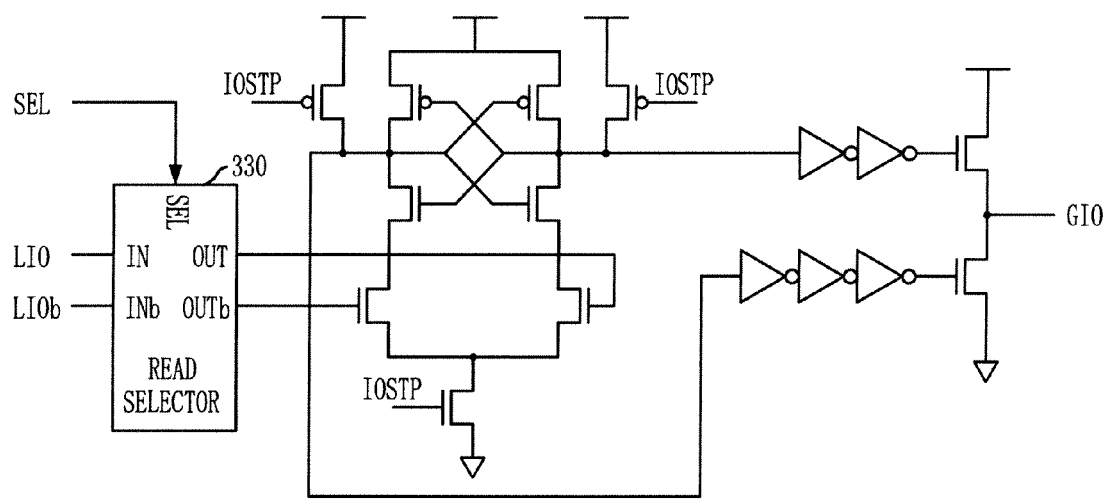
FIG. 9 is a block diagram illustrating how the read selector of FIG. 8 is connected to an input terminal of a typical input/output sense amplifier.

FIG. 9 is a block diagram illustrating how the read selector 330 of FIG. 8 is connected to an input terminal of a typical input/output sense amplifier IOSA.

The input/output sense amplifier IOSA of FIG. 9 corresponds to a typical input/output senses amplifier IOSA adapted to amplify a potential difference between LIO and LIOB. As illustrated in FIG. 9, the read selector 330 of FIG. 8 may be provided at the input terminal of the input/output sense amplifier IOSA.

Figure 10:
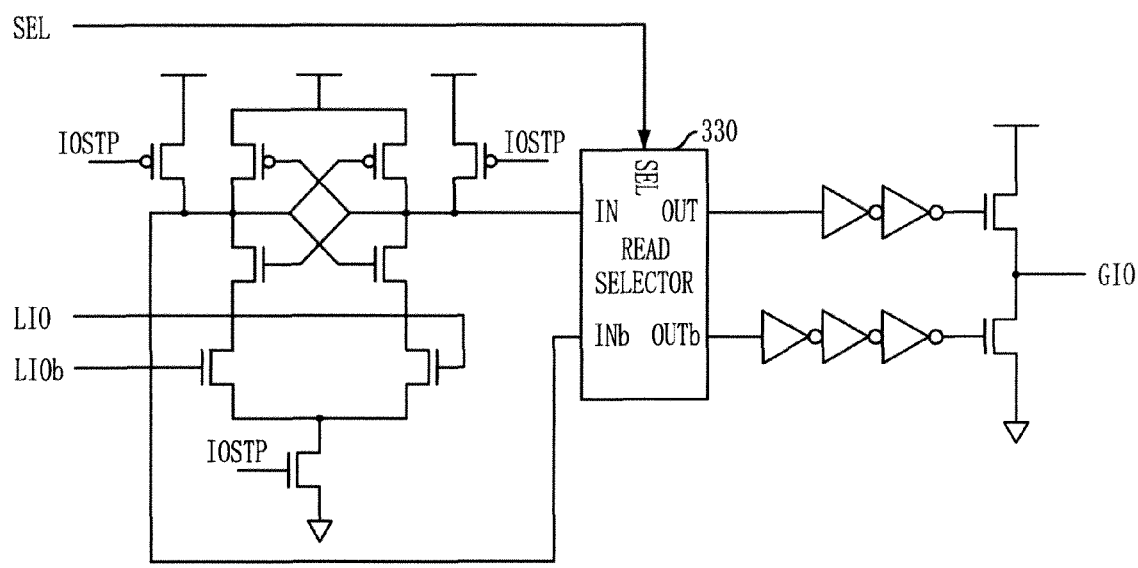
FIG. 10 is a block diagram illustrating how the read selector of FIG. 8 is connected to an output terminal of the typical input/output sense amplifier.

FIG. 10 is a block diagram illustrating how the read selector 330 of FIG. 8 is connected to an output terminal of the typical input/output sense amplifier IOSA.

The read selector 330 may also be provided for inverting data at the input terminal the input/output sense amplifier IOSA like FIG. 9. Alternatively, however, the read selector 330 may be provided for inverting data at the output terminal of the input/output sense amplifier IOSA, as shown in FIG. 10.

Figure 11:
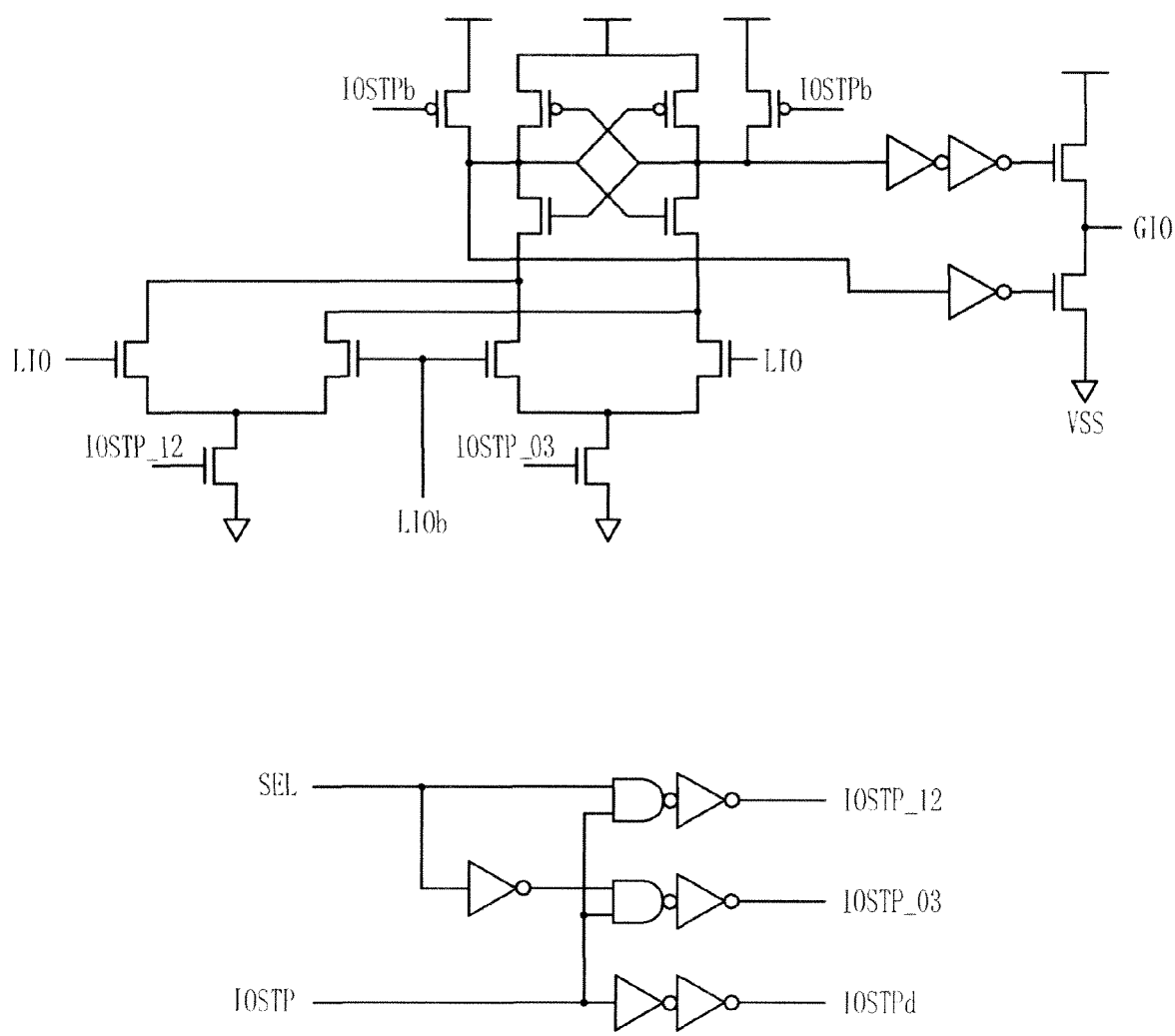
FIG. 11 illustrates a circuit diagram of another embodiment of a read selector of FIG. 3.

FIG. 11 illustrates a circuit diagram of another embodiment of a read selector 330 of FIG. 3.

When the control signal SEL is activated, the read selector 330 of FIG. 11 activates a signal ISOTP_12 to drive a bias transistor receiving the signal ISOTP_12. Therefore, data of the local input/output lines LIO and LIOB are inversely inputted to the input/output sense amplifier IOSA, which is significantly different from the conventional art. Furthermore, the deactivated of the control signal SEL activates a signal ISOTP_03 to drive a bias transistor receiving the signal ISOTP_03. Thus, data of the local input/output lines LIO and LIOB are inputted to the input/output sense amplifier IOSA without inversion like the conventional art.

That is, the read selector 330 of FIG. 11 is different in structure from those of FIGS. 8 to 10 but operates in the same manner as those of FIGS. 8 to 10.

Referring back to FIG. 3, a method for reading/writing data in a semiconductor memory device will be described in accordance with the present invention.

The method for writing data in the semiconductor memory device may include: activating a control signal SEL or a write control signal SEL_WT when an address for accessing a memory cell of a complementary bit line BLB is inputted; and selectively transmitting data of a write path in response to the control signal SEL or the write control signal SEL_WT. Therefore, in accordance with the writing method as above, data having the same phase as data stored in a memory cell of the bit line BL are written to the memory cell of the complementary bit line BLB. The method for reading data in the semiconductor memory device may include: activating the control signal SEL or a read control signal SEL_RD when an address for accessing a memory cell of the complementary bit line BLB is inputted; and selectively transmitting data of a read path in response to the control signal SEL or the read control signal SEL_RD. In accordance with the reading method as above, the data of the complementary bit line BLB are re-inverted and then read out so that the semiconductor memory device can operate normally.

As described above, in accordance with the semiconductor memory device of present invention, it is possible to write data in phase with data stored in a memory cell of a bit line even when external data is written to a memory cell connected to a complementary bit line. That is, when the external data '0' is written, data '0' can be written to all the memory cells of the bit line and the complementary bit line.

As a result, it is easy to prepare a test pattern used in testing a semiconductor memory device. In the conventional semiconductor memory device, the phase of data may differentiate depending on which memory cell the data is written to. For this reason, it is difficult to prepare the test pattern because an address must be considered in preparing the test pattern in the conventional art. However, the present invention provides an advantageous merit that it is unnecessary to consider the address in preparing the test pattern.

Furthermore, it is possible to reuse the same test pattern for various semiconductor memory devices having different configuration of memory cells, thus contributing to the reduction in a time taken for failure analysis and testing of products.

While the present invention has been described with respect to the specific embodiments, it will be apparent to a person of ordinary skill in the art that various changes and modifications may be made without departing from the spirit and scope of the invention as defined in the following claims.

What is claimed is:

1. A method for operating a semiconductor memory device, the method comprising:
    selectively activating one of a write control signal and a read control signal when an address for accessing a memory cell of a complementary bit line is inputted; and
    transmitting a write data of a write path in response to the write control signal and a read data of a read path in response to the read control signal.

2. The method as recited in claim 1, wherein the write data of the write path is transmitted through a write driver.

3. The method as recited in claim 1, wherein the write control signal activated when an address for accessing a memory cell of a complementary bit line is inputted during a write operation, is outputted in response to a signal activated in the write operation of the semiconductor memory device.

4. The method as recited in claim 1, wherein the read data of the read path is inputted to an input/output sense amplifier.

5. The method as recited in claim 1, wherein the control signal activated when an address for accessing a memory cell of a complementary bit line is inputted during a read operation, is outputted in response to a signal activated in the read operation of the memory device.

* * * * *